United States Patent
Cheng et al.

(10) Patent No.: US 12,132,463 B2
(45) Date of Patent: Oct. 29, 2024

(54) BALUN CIRCUIT STRUCTURE AND BALUN DEVICE

(71) Applicant: ANHUI ANUKI TECHNOLOGIES CO., LTD., Hefei (CN)

(72) Inventors: Wei Cheng, Hefei (CN); Chengjie Zuo, Hefei (CN); Jun He, Hefei (CN)

(73) Assignee: ANHUI ANUKI TECHNOLOGIES CO., LTD., Anhui (CN)

( * ) Notice: Subject to any disclaimer, the term of this patent is extended or adjusted under 35 U.S.C. 154(b) by 494 days.

(21) Appl. No.: 17/427,613

(22) PCT Filed: Feb. 9, 2021

(86) PCT No.: PCT/CN2021/076221
§ 371 (c)(1),
(2) Date: Jul. 30, 2021

(87) PCT Pub. No.: WO2021/164647
PCT Pub. Date: Aug. 26, 2021

(65) Prior Publication Data
US 2022/0255526 A1    Aug. 11, 2022

(30) Foreign Application Priority Data
Feb. 19, 2020    (CN) .......................... 202010102858.4

(51) Int. Cl.
*H03H 7/42* (2006.01)
*H01F 17/00* (2006.01)
(Continued)

(52) U.S. Cl.
CPC ........... *H03H 7/42* (2013.01); *H01F 17/0013* (2013.01); *H01P 5/10* (2013.01); *H03H 7/09* (2013.01); *H03H 2001/0085* (2013.01)

(58) Field of Classification Search
CPC ......... H03H 2001/0085; H03H 7/0115; H03H 7/09; H03H 7/42
(Continued)

(56) References Cited

U.S. PATENT DOCUMENTS

| | | | |
|---|---|---|---|
| 6,628,189 B2 * | 9/2003 | Yazaki | H03H 7/42 336/200 |
| 2001/0040495 A1 | 11/2001 | Morikawa | |

FOREIGN PATENT DOCUMENTS

| | | |
|---|---|---|
| CN | 1461488 A | 12/2003 |
| CN | 1753244 A | 3/2006 |

(Continued)

OTHER PUBLICATIONS

Decision to Grant a Patent for the Japanese Patent Application No. 2021-545296 issued by the Japanese Patent Office on Apr. 4, 2023.
(Continued)

*Primary Examiner* — Rakesh B Patel
(74) *Attorney, Agent, or Firm* — IP & T GROUP LLP

(57) ABSTRACT

Provided are balun circuit structure and balun device, the balun circuit structure comprises unbalanced terminal, first and second balanced terminals, grounded power terminal, first, second, third and fourth inductors. The first terminal of the first inductor is connected to the first terminal of the second inductor, the second terminal of the first inductor is connected to the unbalanced terminal, the second terminal of the second inductor is open-circuited, the first terminal of the third inductor and the first terminal of the fourth inductor are connected to the grounded power terminal, the second terminal of the third inductor is connected to the first balanced terminal, the second terminal of the fourth inductor is connected to the second balanced terminal, the first, second, third and fourth inductors are located in different planes, respectively, the first inductor is coupled to the third inductor, and the second inductor is coupled to the fourth inductor.

12 Claims, 5 Drawing Sheets

(51) Int. Cl.
  *H01P 5/10* (2006.01)
  *H03H 7/09* (2006.01)
  *H03H 1/00* (2006.01)

(58) Field of Classification Search
  USPC .......................................... 333/25, 175, 185
  See application file for complete search history.

(56) References Cited

FOREIGN PATENT DOCUMENTS

| | | |
|---|---|---|
| CN | 101689844 A | 3/2010 |
| CN | 111193483 A | 5/2020 |
| CN | 210839501 U | 6/2020 |
| JP | H09260145 A | 10/1997 |
| JP | 2006094462 A | 4/2006 |
| WO | 02086920 A1 | 10/2002 |
| WO | 2009005079 A1 | 1/2009 |

OTHER PUBLICATIONS

International Search Report and Written Opinion for the PCT Application No. PCT/CN2021/076221 by the International Searching Authority on Apr. 30, 2021.
Office Action for the Japanese Patent Application No. 2021-545296 issued by the Japanese Patent Office on Oct. 14, 2022.

\* cited by examiner

BALUN CIRCUIT STRUCTURE AND BALUN DEVICE

CROSS-REFERENCE TO RELATED APPLICATIONS

This application is a National Phase application of PCT application no. PCT/CN2021/076221 filed on Feb. 9, 2021, which claims priority to Chinese Patent Application No. 202010102858.4, filed with the Chinese Patent Office on Feb. 19, 2020, entitled "Balun Circuit Structure and Balun Device", which is incorporated herein by reference in its entirety.

TECHNICAL FIELD

The present disclosure relates to the technical field of electronic circuits, and in particular to a balun circuit structure and a balun device.

BACKGROUND ART

A balun circuit, also called a balanced-unbalanced conversion circuit, generally includes a balanced terminal, two unbalanced terminals, and multiple inductance elements. The inventors have found in research the problem that a prior art balun circuit can hardly be effectively miniaturized during integration and thus occupies a larger spatial area, due to the presence of multiple inductance elements.

SUMMARY

In view of this, the present disclosure provides a balun circuit structure and a balun device to solve the problem of difficulty in effective miniaturization of the prior art balun circuits.

The present disclosure adopts the following technical solutions.

A balun circuit structure includes:
- a connection terminal, including an unbalanced terminal, a first balanced terminal, a second balanced terminal and a grounded power terminal;
- an unbalanced unit, including a first inductor and a second inductor, wherein a first terminal of the first inductor is connected to a first terminal of the second inductor, a second terminal of the first inductor is connected to the unbalanced terminal, and a second terminal of the second inductor is open-circuited; and
- a balanced unit, including a third inductor and a fourth inductor, wherein a first terminal of the third inductor and a first terminal of the fourth inductor are connected to the grounded power terminal, a second terminal of the third inductor is connected to the first balanced terminal, and a second terminal of the fourth inductor is connected to the second balanced terminal,
- wherein the first inductor, the second inductor, the third inductor, and the fourth inductor are located in different planes, respectively, and the first inductor is coupled to the third inductor, and the second inductor is coupled to the fourth inductor.

Optionally, in the above-mentioned balun circuit structure, the first inductor is arranged correspondingly to the third inductor, and the length of the first inductor is different from the length of the third inductor; and/or the second inductor is arranged correspondingly to the fourth inductor, and the length of the second inductor is different from the length of the fourth inductor.

Optionally, in the above-mentioned balun circuit structure, the length of the first inductor is greater than the length of the third inductor.

Optionally, in the above-mentioned balun circuit structure, the length of the second inductor is greater than the length of the fourth inductor.

Optionally, in the above-mentioned balun circuit structure, a projection of the first inductor on the plane where the third inductor is located is at least partially non-overlapping with the third inductor; and/or
a projection of the second inductor on the plane where the fourth inductor is located is at least partially non-overlapping with the fourth inductor.

Optionally, in the above-mentioned balun circuit structure; the first inductor and the third inductor are in planar spiral structure,
wherein the projection of the first inductor on the plane where the third inductor is located is at least partially non-overlapping with the third inductor in a first direction; and the first direction is the same as a width direction of a part of the first inductor that is connected to the unbalanced terminal and as a width direction of a part of the third inductor that is connected to the first balanced terminal.

Optionally, in the above-mentioned balun circuit structure, the second inductor and the fourth inductor are in planar spiral structure,
wherein the projection of the second inductor on the plane where the fourth inductor is located is at least partially non-overlapping with the fourth inductor in a second direction, and the second direction is the same as a width direction of a part of the fourth inductor that is connected to the second balanced terminal.

Optionally, in the above-mentioned balun circuit structure, the unbalanced unit and the balanced unit are arranged in parallel,
wherein a projection of the unbalanced unit and a projection of the balanced unit at least partially overlap to each other in a direction perpendicular to the unbalanced unit and the balanced unit.

Optionally, in the above-mentioned balun circuit structure, the first inductor is parallel to the second inductor, the third inductor, and the fourth inductor,
wherein, in a direction perpendicular to the first inductor, the first inductor and the third inductor are arranged adjacent to each other, and the second inductor and the fourth inductor are arranged adjacent to each other.

Optionally, a distance between the first inductor and the third inductor is the same as a distance between the second inductor and the fourth inductor.

Optionally, in a direction perpendicular to the first inductor, when the first inductor and the third inductor are regarded as an integral structure and the second inductor and the fourth inductor are regarded as an integral structure, the two structures are provided spaced apart from each other.

On the above basis, the present disclosure further provides a balun device, including:
a plurality of circuit boards; and
a balun circuit structure described above, wherein the balun circuit structure is arranged on the plurality of circuit boards.

Optionally, different parts of the balun circuit structure are arranged on different circuit boards of the plurality of circuit boards, respectively.

Optionally, the plurality of circuit boards are provided spaced apart from each other and are located in different planes, so that different parts of the balun circuit structure are located in different planes.

Optionally, the balun device further includes a packaging structure with an accommodating space, so that the balun circuit structure and the circuit boards are packaged in the accommodating space of the packaging structure after the balun circuit structure is arranged on the circuit boards.

In order to enable clearer and easier understanding of the above objects, features, and advantages of the present disclosure, embodiments will be described in detail below by way of example with reference to the accompanying drawings.

Figure 1:
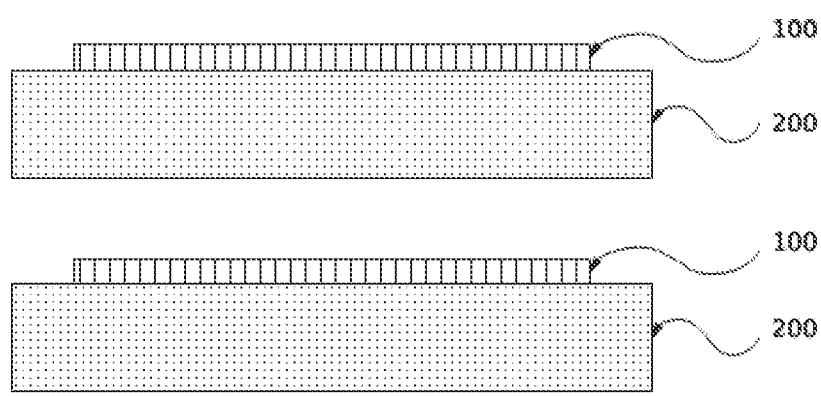
FIG. 1 is a schematic structural diagram of a balun device according to the present disclosure.

Reference Numerals: 10: balun device; 100: balun circuit structure; 111: unbalanced terminal; 112: first balanced terminal; 113: second balanced terminal; 114: grounded power terminal; 121: first inductor; 122: second inductor; 131: third inductor; 132: fourth inductor; 200: circuit board.

DETAILED DESCRIPTION OF THE EMBODIMENTS

The technical solutions of the present disclosure will be described below clearly and completely with reference to the accompanying drawings of the present disclosure in order to further clarify the objects, technical solutions, and advantages of the present disclosure. It is apparent that the embodiments to be described are optional embodiments, but not all the embodiments, of the present disclosure. Generally, the components of the embodiments of the present disclosure, as described and illustrated in the figures herein, may be arranged and designed in a wide variety of different configurations.

Thus, the following detailed description of the embodiments of the present disclosure, as represented in the figures, is not intended to limit the scope of the present disclosure as claimed, but is merely representative of selected embodiments of the present disclosure. All the other embodiments obtained by in those of ordinary skill in the art in light of the embodiments of the present disclosure without inventive efforts will fall within the scope of the present disclosure as claimed.

As shown in FIG. 1, the present disclosure provides a balun device 10. Here, the balun device 10 may include a balun circuit structure 100 and a circuit is board 200.

Optionally, there may be a plurality of circuit boards 200. In this way, the balun circuit structure 100 may be arranged on the plurality of circuit boards 200. For example, different parts of the balun circuit structure 100 may be arranged on different circuit boards 200 of the plurality of circuit boards 200, respectively.

Here, the plurality of circuit boards 200 may be provided spaced apart from each other and may be located in different planes, so that different parts of the balun circuit structure 100 can also be located in different planes, thereby reducing a spatial area occupied by the balun device 10 and facilitating its miniaturization during integration (packaging).

Optionally, the specific relative positional relationship among the plurality of circuit boards 200 is not limited and may be selected according to actual application requirements.

For example, the plurality of circuit boards 200 may be arranged in parallel. For another example, the plurality of circuit boards 200 may be arranged in a non-parallel manner. For example, there is a non-zero angle between different circuit boards 200.

It can be understood that the balun device 10 may further include a packaging structure with an accommodating space on the basis of the above-mentioned structure and depending on certain application requirements. In this way, after the balun circuit structure 100 is arranged on the circuit boards 200, the balun circuit structure 100 and the circuit boards 200 can also be packaged in the accommodating space of the packaging structure.

It should be noted that, in the above description and in the following description, the term "a plurality of" means two or more, namely, encompasses two.

Figure 2:
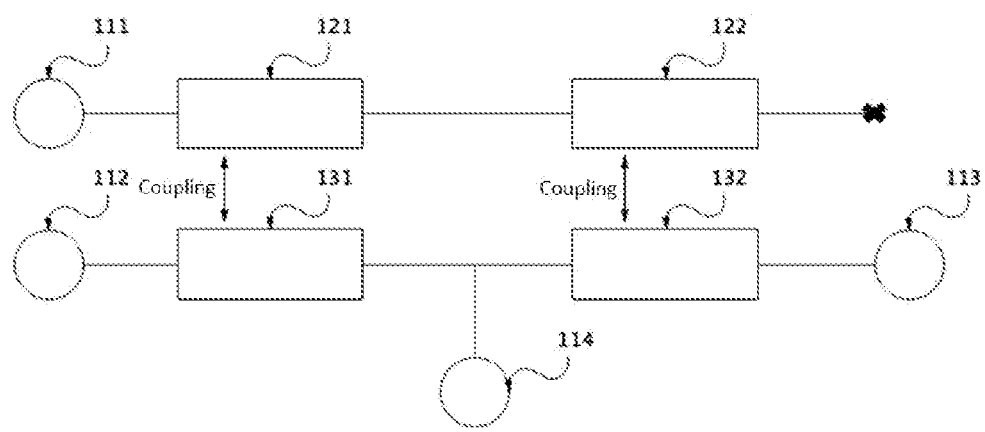
FIG. 2 is a circuit schematic diagram of a balun circuit structure according to the present disclosure.

As shown in FIG. 2, the present disclosure further provides a balun circuit structure 100 that can be used in the balun device 10 described above. Here, the balun circuit structure 100 may include a connection terminal, an unbalanced unit, and a balanced unit.

Optionally, the connection terminal may include an unbalanced terminal 111, a first balanced terminal 112, a second balanced terminal 113, and a grounded power terminal 114. The unbalanced unit may include a first inductor 121 and a second inductor 122. The balanced unit may include a third inductor 131 and a fourth inductor 132.

Here, the first terminal of the first inductor 121 is connected to the first terminal of the second inductor 122, and the second terminal of the first inductor 121 is connected to the unbalanced terminal 111. The second terminal of the second inductor 122 is open-circuited. The first terminal of the third inductor 131 and the first terminal of the fourth inductor 132 are connected to the grounded power terminal 114, the second terminal of the third inductor 131 is connected to the first balanced terminal 112, and the second terminal of the fourth inductor 132 is connected to the second balanced terminal 113.

Moreover, the first inductor 121, the second inductor 122, the third inductor 131, and the fourth inductor 132 are located in different planes, respectively, and the first inductor 121 is coupled to the third inductor 131, and the second inductor 122 is coupled to the fourth inductor 132.

Based on the above arrangement, the first inductor 121, the second inductor 122, the third inductor 131, and the fourth inductor 132 are respectively arranged in different planes, thus it is ensured that a smaller spatial area will be occupied during the integration process. In this way, the problem of the prior art balun circuits can be ameliorated, which can hardly be effectively miniaturized because multiple inductance elements are arranged in the same plane. Therefore, the balun circuit structure according to the present disclosure is of great practical value. For example, it is manufactured with reduced cost and is not excessively restricted by the space of an application environment.

Optionally, the specific functions of the multiple ports included in the connection terminal are not limited and may be selected according to actual application requirements.

For example, the unbalanced terminal 111 may be used as an input terminal of the balun circuit structure 100 for receiving a first signal from an external device (e.g., an antenna). In this way, after the first signal is converted by the in first inductor 121, the second inductor 122, the third inductor 131, and the fourth inductor 132 into two different signals, for example, a second signal and a third signal, the first balanced terminal 112 and the second balanced terminal 113 may be used to send the second signal and the third signal to other devices, respectively. For example, the first balanced terminal 112 may be used to send the second signal, and the second balanced terminal 113 may be used to send the third signal.

For another example, the first balanced terminal 112 and the second balanced terminal 113 may be used as a first input terminal and a second input terminal of the balun circuit structure 100, respectively, for receiving external fourth signal and fifth signal, respectively. For example, the first balanced terminal 112 may be used to acquire the fourth signal, and the second balanced terminal 113 may be used to acquire the fifth signal. In this way, after the fourth signal and the fifth signal are converted by the first inductor 121, the second inductor 122 the third inductor 131 and the fourth inductor 132 into a sixth signal, the unbalanced terminal 111 may send the sixth signal to another device.

Here, the specific function of the grounded power terminal 114 is not limited under different application requirements and may be selected according to actual application requirements.

For example, when other devices (e.g., amplifiers that need to be powered through the grounded power terminal 114) connected to the first balanced terminal 112 and the second balanced terminal 113 need to obtain electric energy through the balun circuit structure 100, namely, need to be powered through the balun circuit structure 100, the grounded power terminal 114 may be used as a power terminal of the balun circuit structure 100 for being connected to a DC power supply device, to supply power to the other devices.

For another example, when other devices (e.g., amplifiers that do not need to be powered through the grounded power terminal 114) connected to the first balanced terminal 112 and the second balanced terminal 113 do not need to be powered through the balun circuit structure 100, the grounded power terminal 114 may be used as a grounded terminal of the balun circuit structure 100 for being grounded.

Optionally, the relative positional relationship between the unbalanced unit and the balanced unit is not limited and may be selected according to actual application requirements.

For example, the unbalanced unit and the balanced unit may be arranged in parallel. For another example, the unbalanced unit and the balanced unit may be arranged in a non-parallel manner. For example; the angle between the unbalanced unit and the balanced unit is not zero.

Here, in order to further reduce the spatial area occupied by the balun circuit structure 100 on the basis of the parallel arrangement of the unbalanced unit and the balanced unit, optionally, the projection of the unbalanced unit and the projection of the balanced unit at least partially overlap to each other in a direction perpendicular to the unbalanced unit and the balanced unit.

In other words, the projection of the unbalanced unit and the projection of the balanced unit on a plane parallel to the unbalanced unit and the balanced unit at least partially overlap to each other, namely, partially overlap or wholly overlap (which may be arranged based on the spatial area occupied during the integration process).

Figure 3:
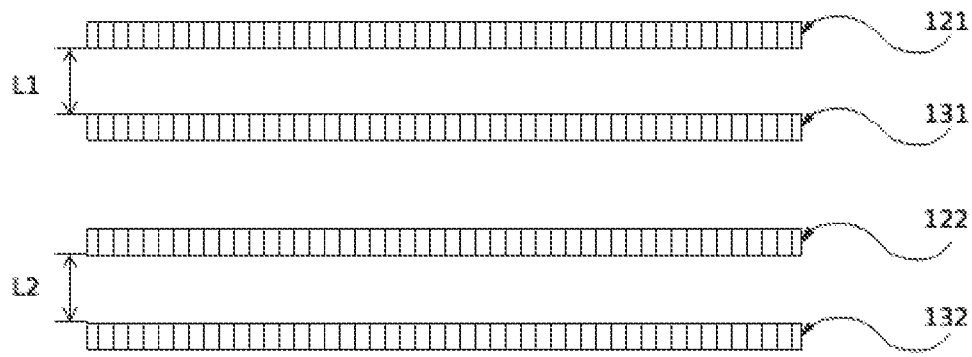
FIG. 3 is a schematic diagram showing the relative positional relationships among a first inductor, a second inductor, a third inductor, and a fourth inductor according to the present disclosure.

Moreover, based on the above example in which the unbalanced unit and the balanced unit are arranged in parallel, optionally, as shown in FIG. 3, the first inductor 121 is arranged in parallel to the second inductor 122, the third inductor 131, and the fourth inductor 132, in order to give higher amplitude consistency between the signal at the first balanced terminal 112 and the signal at the second balanced terminal 113.

In other words, the plane where the first inductor 121 is located, the plane where the second inductor 122 is located, the plane where the third inductor 131 is located, and the plane where the fourth inductor 132 is located are arranged in parallel to each other.

Moreover, in a direction perpendicular to the first inductor 121, the first inductor 121 and the third inductor 131 are arranged adjacent to each other, and the second inductor 122 and the fourth inductor 132 are arranged adjacent to each other. In other words, in the direction perpendicular to the first inductor 121, the first inductor 121 and the third inductor 131 are regarded as an integral structure, and the second inductor 122 and the fourth inductor 132 are regarded as an integral structure, and the two structures are provided spaced apart from each other.

Figure 4:
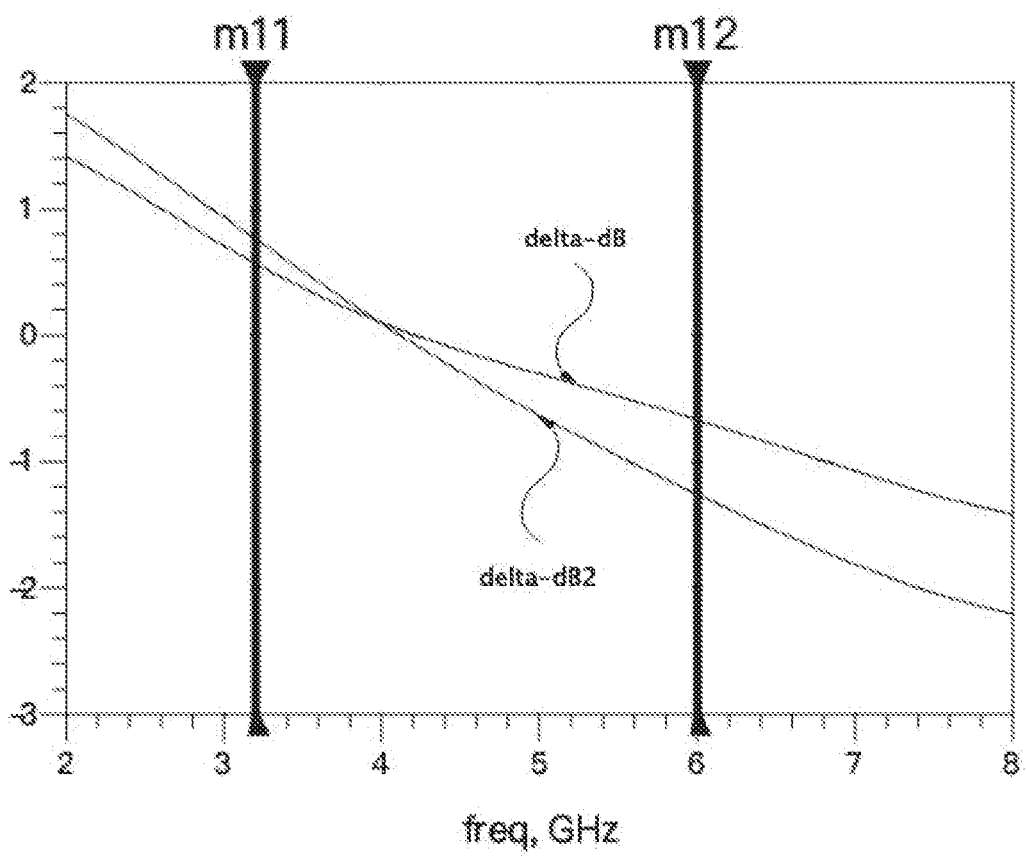
FIG. 4 is a schematic diagram showing the amplitude consistency relationship between a signal at a first balanced terminal and a signal at a second balanced terminal according to the present disclosure.

Based on the above-mentioned arrangement, better amplitude consistency is achieved between the signal at the first balanced terminal 112 and the signal at the second balanced terminal 113, as compared with the prior art technical solution, in which "the first inductor 121 and the third inductor 131 are regarded as an integral structure, the second inductor 122 and the fourth inductor 132 are regarded as an integral structure, and the two structures are provided not spaced apart from each other". As shown in FIG. 4, the amplitude inconsistency corresponding to 3.2 GHz is reduced from 0.763 dB to 0.569 dB, and the amplitude inconsistency corresponding to 6 GHz is reduced from |−1.26| dB to |−0.67| dB, after the spaced arrangement is adopted.

It can be understood that the specific positional relationships among the first inductor 121, the second inductor 122, the third inductor 131, and the fourth inductor 132 in the direction perpendicular to the first inductor 121 are also not limited and may be selected based on actual application requirements.

For example, the first inductor 121, the third inductor 131, the second inductor 122, and the fourth inductor 132 may be sequentially provided in the direction perpendicular to the first inductor 121.

For another example, the third inductor 131, the first inductor 121, the fourth inductor 132, and the second inductor 122 may be sequentially provided in the direction perpendicular to the first inductor 121.

Moreover, optionally, on the basis of the parallelity of the first inductor 121 to the second inductor 122, the third inductor 131, and the fourth inductor, the distance (L1 as shown in FIG. 3) between the first inductor 121 and the third inductor 131 is the same as the distance (L2 as shown in FIG. 3) between the second inductor 122 and the fourth inductor 132, in order to further improve the amplitude consistency between the signal at the first balanced terminal 112 and the signal at the second balanced terminal 113.

In this way, the electromagnetic coupling distance between the first inductor 121 and the third inductor 131 can be made the same as the electromagnetic coupling distance between the second inductor 122 and the fourth inductor 132, thereby ensuring higher amplitude consistency between the signal at the first balanced terminal 112 connected to the third inductor 131 and the signal at the second balanced terminal 113 connected to the fourth inductor 132.

Optionally, the relationship between the length of the unbalanced unit and the length of the balanced unit is also not limited and may be selected according to actual application requirements.

For example, the length of the unbalanced unit may be the same as the length of the balanced unit. Moreover, in a specific application example, the length of the first inductor 121 may be equal to the length of the third inductor 131, and the length of the second inductor 122 may be equal to the length of the fourth inductor 132.

For another example, it has been found, based on the researches made by the inventors of the present disclosure, that the signal can be converted by the unbalanced unit and the balanced unit with reduced loss when the unbalanced unit and the balanced unit are provided with different lengths.

Here, the specific setting of different lengths of the unbalanced unit and the balanced unit is also not limited and may be selected according to actual application requirements.

Here, on the basis of the arrangement of the first inductor 121 and the third inductor 131 corresponding to each other and the arrangement of the second inductor 122 and the fourth inductor 132 corresponding to each other, the length of the first inductor 121 is different from the length of the third inductor 131, and/or the length of the second inductor 122 is different from the length of the fourth inductor 132.

For example, the length of the first inductor 121 may be different from the length of the third inductor 131, and the length of the second inductor 122 may be the same as the length of the fourth inductor 132.

For another example, the length of the first inductor 121 may be the same as the length of the third inductor 131, and the length of the second inductor 122 may be different from the length of the fourth inductor 132.

For yet another example, the length of the first inductor 121 may be different from the length of the third inductor 131, and the length of the second inductor 122 may be different from the length of the fourth inductor 132.

Moreover, the specific setting of different lengths of the respective inductance elements is also not limited and may be selected according to actual application requirements.

For example, for the first inductor 121 and the third inductor 131, the length of the first inductor 121 may be greater than the length of the third inductor 131. Alternatively, the length of the first inductor 121 may be smaller than the length of the third inductor 131.

For another example, for the second inductor 122 and the fourth inductor 132, the length of the second inductor 122 may be greater than the length of the fourth inductor 132. Alternatively, the length of the second inductor 122 may be smaller than the length of the fourth inductor 132.

Figure 5:
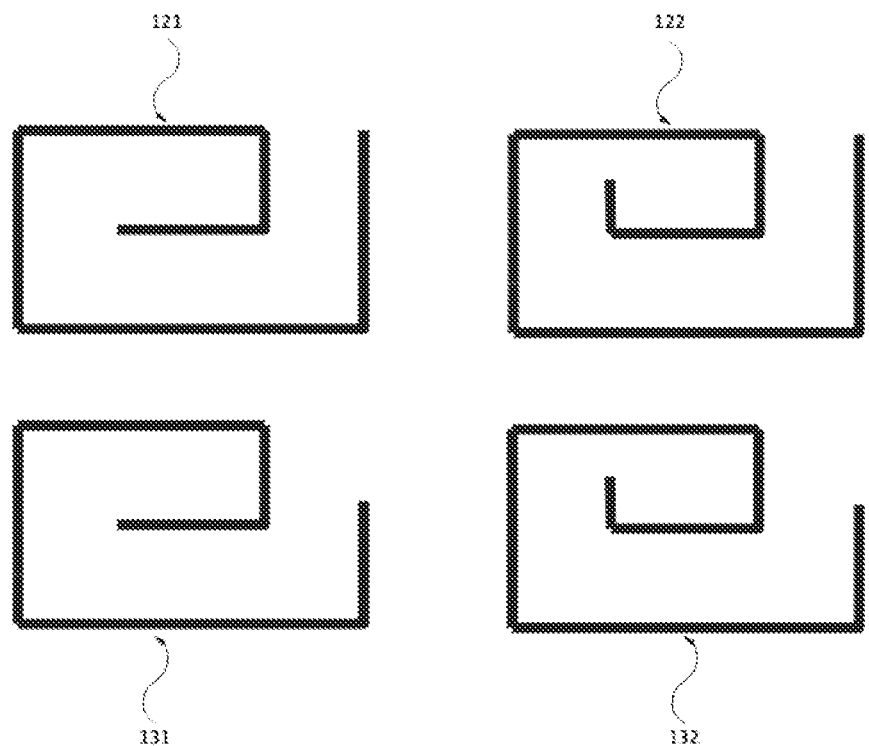
FIG. 5 is a schematic diagram showing the length relationships between the first inductor, the second inductor, the third inductor, and the fourth inductor according to the present disclosure.

Based on the above settings, the inventors of the present disclosure have found in research that lower loss is achieved in a certain frequency range with the use of a structure in which "the length of the first inductor 121 is set to be greater than the length of the third inductor 131, and the length of the second inductor 122 is set to be greater than the length of the fourth inductor 132" as shown in FIG. 5, as compared to a structure in which "the length of the first inductor 121 is set equally to the length of the third inductor 131, and the length of the second inductor 122 is set equally to the length of the fourth inductor 132".

Figure 6:
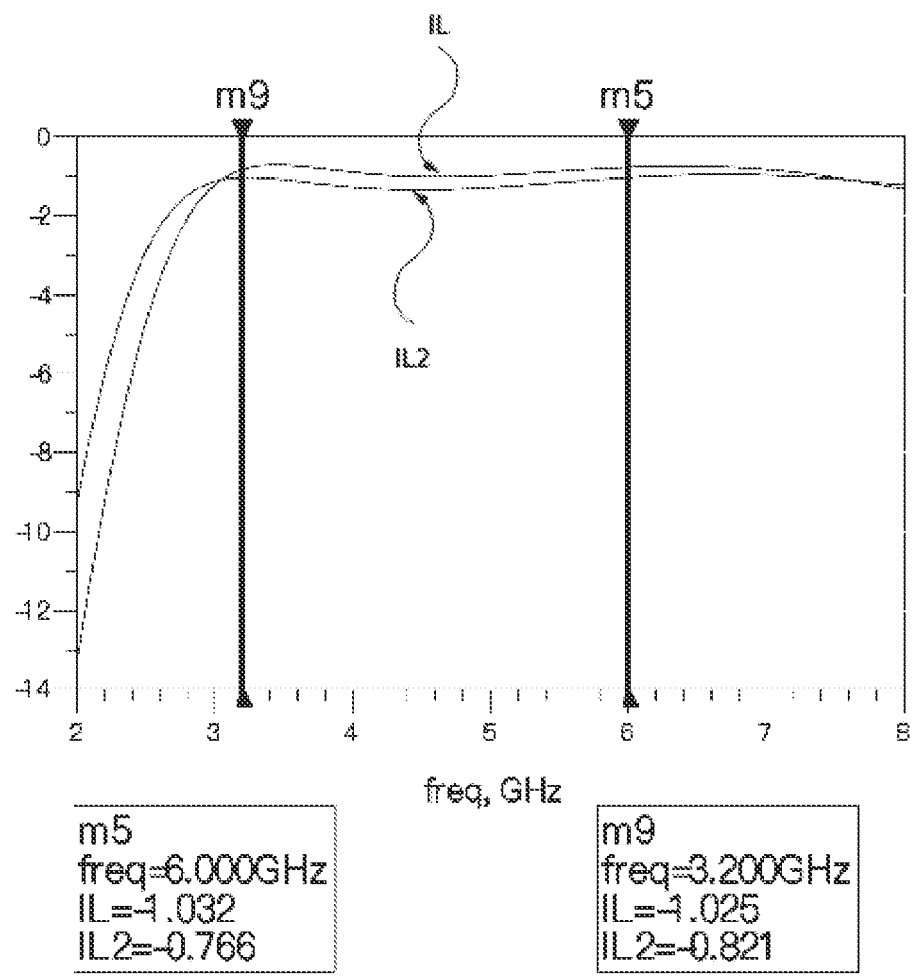
FIG. 6 is a schematic effect diagram showing signal losses under different length relationships between the first inductor, the second inductor, the third inductor, and the fourth inductor according to the present disclosure.

As shown in FIG. 6, as the frequency of the signal increases from 3.2 GHz to 6.0 GHz, the loss varies between −1.025 dB and −1.032 dB in the case of the use of the above-mentioned structure in which "the length of the first inductor 121 is set equally to the length of the third inductor 131, and the length of the second inductor 122 is set equally to the length of the fourth inductor 132". In the case of the use of the above-mentioned structure in which "the length of the first inductor 121 is set to be greater than the length of the third inductor 131, and the length of the second inductor 122 is set to be greater than the length of the fourth inductor 132", the loss varies between −0.821 dB and −0.766 dB, which is significantly less than the loss generated when using the above-mentioned first technical solution.

Further, it has been found by the researches made by the inventors of the present disclosure that the degree of overlap between the unbalanced unit and the balanced unit can affect the coupling coefficient between the unbalanced unit and the balanced unit, thereby affecting the central operating frequency of the balun circuit structure 100.

Therefore, the degree of overlap between the unbalanced unit and the balanced unit may be set differently depending on the required different central operating frequencies of the balun circuit structure 100.

For example, the unbalanced unit and the balanced unit may be arranged to completely overlap with each other.

For another example, the unbalanced unit and the balanced unit ray be arranged to incompletely overlap with each other, in order to reduce the complexity of a process of adjusting the central operating frequency of the balun circuit structure 100.

In detail, the following arrangement may be made on the basis of the arrangement of the first inductor 121 and the third inductor 131 corresponding to each other and the arrangement of the second inductor 122 and the fourth inductor 132 corresponding to each other.

The projection of the first inductor 121 on the plane where the third inductor 131 is located is at least partially non-overlapping with the third inductor 131: and/or the projection of the second inductor 122 on the plane where the fourth inductor 132 is located is at least partially non-overlapping with the fourth inductor 132.

For example, the projection of the first inductor 121 on the plane where the third inductor 131 is located is at least partially non-overlapping with the third inductor 131. Moreover, the projection of the second inductor 122 on the plane where the fourth inductor 132 is located wholly overlaps with the fourth inductor 132.

For another example, the projection of the first inductor 121 on the plane where the third inductor 131 is located wholly overlaps with the third inductor 131. Moreover, the projection of the second inductor 122 on the plane where the fourth inductor 132 is located is at least partially non-overlapping with the fourth inductor 132.

For yet another example, the projection of the first inductor 121 on the plane where the third inductor 131 is located is at least partially non-overlapping with the third inductor 131. Moreover, the projection of the second inductor 122 on the plane where the fourth inductor 132 is located is at least partially non-overlapping with the fourth inductor 132.

Here, on the basis of the above example, the specific non-overlapping arrangement of two inductance elements arranged correspondingly to each other is not limited and may be selected according to actual application requirements.

For example, for the first inductor 121 and the third inductor 131, in any direction in the plane where the third inductor 131 is located, the projection of the first inductor 121 on the plane is arranged to be non-overlapping with the third inductor 131. For the second inductor 122 and the fourth inductor 132, in any direction in the plane where the fourth inductor 132 is located, the projection of the second inductor 122 on the plane is arranged to be non-overlapping with the fourth inductor 132.

For another example, in comprehensive consideration of the problem of a larger spatial area occupied by the balun circuit structure 100 due to non-overlapping arrangement, the first inductor 121 and the third inductor 131 may be arranged to be non-overlapping in only one direction; and the second inductor 122 and the fourth inductor 132 may also be arranged to be non-overlapping in only one direction.

Figure 7:
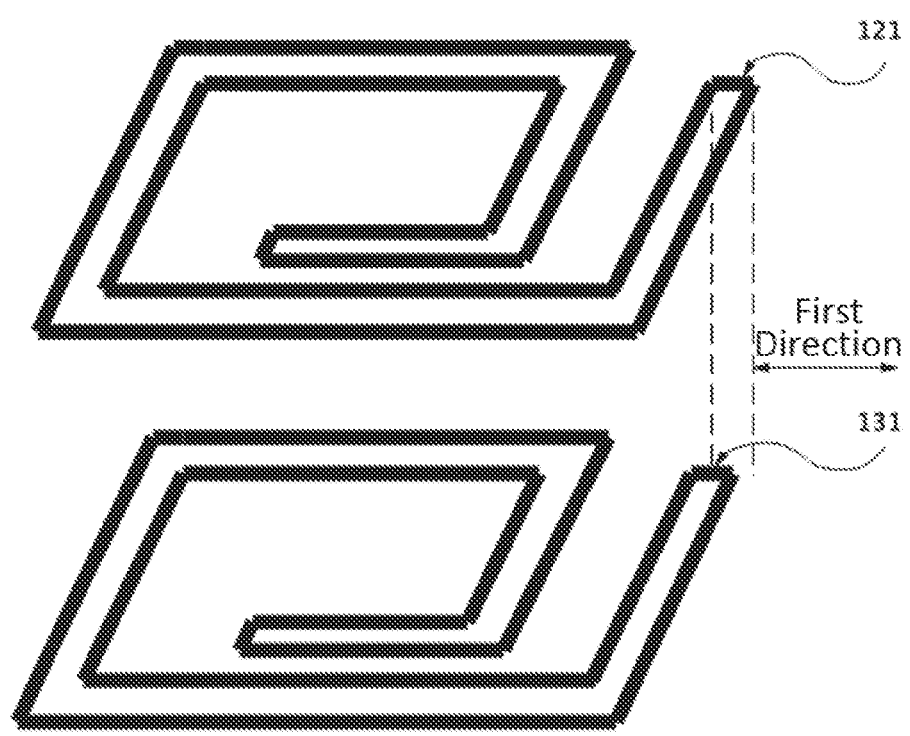
FIG. 7 is a schematic diagram showing the relative positional relationship between the first inductor and the second inductor according to the present disclosure.

In detail, in a specific application example, as shown in FIG. 7, the first inductor 121 and the third inductor 131 may be in planar spiral structures, and the second inductor 122 and the fourth inductor 132 may also be in planar spiral structures.

On this basis, for the first inductor 121 and the third inductor 131 the projection of the first inductor 121 on the plane where the third inductor 131 is located may be at least partially non-overlapping with the third inductor 131 in in a first direction, and the first direction is the same as a width direction of a part of the first inductor 121 that is connected to the unbalanced terminal 111 and as a width direction of a part of the third inductor 131 that is connected to the first balanced terminal 112.

For the second inductor 122 and the fourth inductor 132, the projection of the second inductor 122 on the plane where the fourth inductor 132 is located may be at least partially non-overlapping with the fourth inductor 132 in a second direction, and the second direction is the same as a width direction of a part of the fourth inductor 132 that is connected to the second balanced terminal 113.

It should be noted that, in the above-mentioned structure, the first direction may be the same as or different from the second direction.

Here, in this embodiment, in order to allow a smaller spatial area to be occupied by the balun circuit structure 100, the first direction may be the same as the second direction. In other words, the first inductor 121, the second inductor 122, the third inductor 131, and the fourth inductor 132 may be arranged in the same manner.

In summary, the balun circuit structure 100 and the balun device 10 according to the present disclosure are ensured to occupy a smaller spatial area during the integration process, since the first inductor 121, the second inductor 122, the third inductor 131, and the fourth inductor 132 are arranged in different planes, respectively.

The above description is merely illustrative of preferred embodiments of the present disclosure and is not intended to limit the present disclosure. It will be understood by those skilled in the art that various modifications and variations may be made to the present disclosure. Any modifications, equivalent alternatives, improvements and so on made within the spirit and principle of the present disclosure are intended to be encompassed within the scope of protection of the present disclosure.

INDUSTRIAL APPLICABILITY

The present disclosure provides a balun circuit structure and a balun device, which can solve the problem of difficulty in effective miniaturization of the prior art balun circuits caused because multiple inductance elements are arranged in the same plane. Hence, the balun circuit structure and the balun device according to the present disclosure are of great practical value. For example, they are manufactured with reduced costs and are not excessively restricted by the space of an application environment.

What is claimed is:

1. A balun device, comprising:
a plurality of circuit boards; and
a balun circuit structure, wherein the balun circuit structure comprising a connection terminal, comprising an unbalanced terminal, a first balanced terminal, a second balanced terminal and a grounded power terminal;
an unbalanced unit, comprising a first inductor and a second inductor, wherein a first terminal of the first inductor is connected to a first terminal of the second inductor, a second terminal of the first inductor is connected to the unbalanced terminal, and a second terminal of the second inductor is open-circuited; and
a balanced unit, comprising a third inductor and a fourth inductor, wherein a first terminal of the third inductor and a first terminal of the fourth inductor are connected to the grounded power terminal, a second terminal of the third inductor is connected to the first balanced terminal, and a second terminal of the fourth inductor is connected to the second balanced terminal,
wherein the first inductor, the second inductor, the third inductor and the fourth inductor are located in different planes, respectively, and the first inductor is coupled to the third inductor, and the second inductor is coupled to the fourth inductor;
wherein the first inductor is arranged correspondingly to the third inductor, and a length of the first inductor is different from a length of the third inductor; and/or
the second inductor is arranged correspondingly to the fourth inductor, and a length of the second inductor is different from a length of the fourth inductor;
wherein the balun circuit structure is arranged on the plurality of circuit boards;
the balun device further comprising a packaging structure with an accommodating space, so that the balun circuit structure and the circuit boards are packaged in the accommodating space of the packaging structure after the balun circuit structure is arranged on the circuit boards.

2. The balun device according to claim 1, wherein different parts of the balun circuit structure are arranged on different circuit boards of the plurality of circuit boards, respectively.

3. The balun device according to claim 2, wherein the plurality of circuit boards are provided spaced apart from each other and are located in different planes, so that different parts of the balun circuit structure are located in different planes.

4. The balun device according to claim 1, wherein a length of the first inductor is greater than a length of the third inductor.

5. The balun device according to claim 1, wherein a length of the second inductor is greater than a length of the fourth inductor.

6. The balun device according to claim 1, wherein a projection of the first inductor on a plane where the third inductor is located is at least partially non-overlapping with the third inductor; and/or
a projection of the second inductor on a plane where the fourth inductor is located is at least partially non-overlapping with the fourth inductor.

7. The balun device according to claim 6, wherein the first inductor and the third inductor are in a planar spiral structure,
wherein the projection of the first inductor on the plane where the third inductor is located is at least partially non-overlapping with the third inductor in a first direction, wherein the first direction is the same as a width direction of a part of the first inductor that is connected to the unbalanced terminal and as a width direction of a part of the third inductor that is connected to the first balanced terminal.

8. The balun device according to claim 6, wherein the second inductor and the fourth inductor are in a planar spiral structure,
wherein the projection of the second inductor on the plane where the fourth inductor is located is at least partially non-overlapping with the fourth inductor in a second direction, wherein the second direction is the same as a width direction of a part of the fourth inductor that is connected to the second balanced terminal.

9. The balun device according to claim 1, wherein the unbalanced unit and the balanced unit are arranged in parallel,
wherein a projection of the unbalanced unit and a projection of the balanced unit at least partially overlap to each other in a direction perpendicular to the unbalanced unit and the balanced unit.

10. The balun device according to claim 1, wherein the first inductor is parallel to the second inductor, the third inductor and the fourth inductor,
wherein, in a direction perpendicular to the first inductor, the first inductor and the third inductor are arranged as being adjacent to each other, and the second inductor and the fourth inductor are arranged as being adjacent to each other.

11. The balun device according to claim 10, wherein a distance between the first inductor and the third inductor is the same as a distance between the second inductor and the fourth inductor.

12. The balun device according to claim 1, wherein, in a direction perpendicular to the first inductor, when the first inductor and the third inductor are regarded as one integral structure and the second inductor and the fourth inductor are regarded as one integral structure, the two structures are provided spaced apart from each other.

* * * * *